(12) United States Patent
Raskin et al.

(10) Patent No.: US 7,585,748 B2
(45) Date of Patent: Sep. 8, 2009

(54) PROCESS FOR MANUFACTURING A MULTILAYER STRUCTURE MADE FROM SEMICONDUCTING MATERIALS

(75) Inventors: Jean-Pierre Raskin, Saint Germain (BE); Dimitri Lederer, Ernage (BE); François Brunier, Grenoble (FR)

(73) Assignees: S.O.I.Tec Silicon on Insulator Technologies, Bernin (FR); Université Catholique de Louvain, Louvain-la-Neuve (BE)

( * ) Notice: Subject to any disclaimer, the term of this patent is extended or adjusted under 35 U.S.C. 154(b) by 483 days.

(21) Appl. No.: 11/389,469

(22) Filed: Mar. 24, 2006

(65) Prior Publication Data

US 2006/0166451 A1 Jul. 27, 2006

Related U.S. Application Data

(63) Continuation of application No. PCT/IB2004/003340, filed on Sep. 27, 2004.

(30) Foreign Application Priority Data

Sep. 26, 2003 (FR) .................................. 03 11347

(51) Int. Cl.
*H01L 21/30* (2006.01)
*H01L 21/46* (2006.01)

(52) U.S. Cl. ............................. 438/455; 257/E21.567

(58) Field of Classification Search .......... 257/E21.567; 438/455
See application file for complete search history.

(56) References Cited

U.S. PATENT DOCUMENTS 3,956,025 A * 5/1976 Statz et al. ................... 148/105
4,883,215 A * 11/1989 Goesele et al. ............... 438/455
5,670,411 A    9/1997 Yonehara et al. ............... 437/62
5,773,151 A    6/1998 Begley et al. ................ 428/446
5,773,152 A    6/1998 Okonogi ..................... 428/446
6,091,112 A    7/2000 Kwon ........................ 257/347
6,091,113 A    7/2000 Tanaka ....................... 257/355
6,171,932 B1   1/2001 Shiota ....................... 438/455
6,368,938 B1   4/2002 Usenko ....................... 438/407
6,426,274 B1   7/2002 Tayanaka ..................... 438/458
6,472,711 B1  10/2002 Shiota ....................... 257/347
6,548,382 B1   4/2003 Henley et al. ................ 438/526
6,774,435 B1   8/2004 Matsumoto et al. ............ 257/347
2002/0047169 A1  4/2002 Kuinikiyo .................. 257/410
2003/0008437 A1  1/2003 Inoue et al. .................. 438/49
2003/0129780 A1  7/2003 Auberton-Herve ........... 438/49
2007/0032040 A1  2/2007 Lederer ...................... 438/478

FOREIGN PATENT DOCUMENTS

EP    0 975 011 A1    1/2000

(Continued)

OTHER PUBLICATIONS

H. S. Gamble et al., "Low-Loss CPW Lines on Surface Stabilized High-Resistivity Silicon", IEEE Microwave And Guided Wave Letters, vol. 9, No. 10, pp. 395-397 (1999).

(Continued)

*Primary Examiner*—Asok K Sarkar
(74) *Attorney, Agent, or Firm*—Winston & Strawn LLP

(57) ABSTRACT

The invention relates to a process for manufacturing a multilayer structure made from semiconducting materials that include an active layer, a support layer and an electrically insulating layer between the active layer and the support layer. The process includes the step of modifying the density of carrier traps or the electrical charge within the electrically insulating layer in order to minimize electrical losses in the structure support layer.

20 Claims, 4 Drawing Sheets

FOREIGN PATENT DOCUMENTS

| | | |
|---|---|---|
| EP | 1 014 452 B1 | 5/2006 |
| FR | 2 794 897 A | 12/2000 |
| WO | WO/2005/031842 A2 | 4/2005 |

OTHER PUBLICATIONS

NV. Zhao et al., "Interface Loss Mechanism of Millimeter-Wave Coplanar Waveguides on Silicon", IEEE Transactions On Microwave Theory And Techniques, vol. 50, No. 1, pp. 407-410 (2002).

Francesco Svelto et al., "A Bond-Wire Inductor-MOS Varactor VCO Tunable From 1.8 to 2.4 GHz", Short Papers, IEEE Transactions On Microwave Theory And Techniques, vol. 50, No. 1, pp. 403-406 (2002).

Adolfo C. Reyes et al., "Coplanar Waveguides and Microwave Inductors on Silicon Substrates", IEEE Transactions On Microwave Theory And Techniques, vol. 43, No. 9, pp. 2016-2022 (1995).

Yunhong Wu et al., "$SiO_2$ Interface Layer Effects on Microwave Loss of High-Resistivity CPW Line", IEEE Microwave And Guided WaveLetters, vol. 9, No. 1, pp. 10-12 (1999).

* cited by examiner $$\gamma = (\alpha_{cond} + \alpha_{sub}) + j\beta = \sqrt{(R_{eff} + j\omega L_{eff}) \cdot (G_{eff} + j\omega C_{eff})}$$

$$\alpha_{sub,uax} \approx \frac{G_{eff}}{2}\sqrt{\frac{L_{eff}}{C_{eff}}}$$

PROCESS FOR MANUFACTURING A MULTILAYER STRUCTURE MADE FROM SEMICONDUCTING MATERIALS

CROSS-REFERENCE TO RELATED APPLICATIONS

This application is a continuation of International application PCT/IB2004/003340 filed Sep. 27, 2004, the entire content of which is expressly incorporated herein by reference.

BACKGROUND ART

This invention relates to a process for manufacturing a multilayer structure made from semiconducting materials and comprising an active layer, a support layer and an electrically insulating layer between the active layer and the support layer. The invention also relates to structures obtained using such a process. Note that the invention is applicable to thin structures in the form of wafers, of the type used for microelectronics, optical and optronic applications.

In the remainder of this text, the general expression "structure concerned by the invention" will be used to denote a structure like that mentioned above, of the multilayer structure type made from semiconducting or semiconductor materials and comprising an active layer, a support layer and an electrically insulating layer between the active layer and the support layer. The multilayer structures typically combines several layers, some of which are made from different materials.

Thus, one application of the invention is the manufacture of SOI (Silicon On Insulator) type structures. An SOI of this type thus usually comprises:

an active layer made from monocrystalline silicon with a low resistivity (of the order of a few Ohms.cm), a support layer may be made of silicon with a significantly higher resistivity, typically more than 1000 Ohms.cm, and an electrically insulating layer between these two layers, for example an SiO2 layer.

The so-called "active" layer is named this way because components will be placed on it, typically electronic or optronic components.

It is desired that the multilayer structures concerned by the invention are associated with the lowest possible electrical losses. Note that in this text, "losses" refers to electrical losses in the structure support layer, the losses originating from polarized operation of the components made on the active layer. These losses are disadvantageous, to the extent that they affect the electrical efficiency of this structure and can generate noise affecting the signal quality in the active layer (particularly for very high frequency applications—in other words for frequencies typically more than 10 GHz).

Thus, structures to which the invention is applicable usually have:

a low electrical resistivity (of the order of 5 to 30 $\Omega$.cm) at their active layer, to enable good interaction of components installed on this layer, and a much higher resistivity at the layers that support this active layer, to avoid electrical losses in the structure.

To achieve this, the support layer in a structure concerned by the invention (typically, but not necessarily an SOI) will typically have a much higher resistivity than the active layer (for example more than 1000 $\Omega$.cm). The high resistivity of layers supporting the active layer of these structures is thus designed to reduce loses associated with the structure.

Thus, there is a need for structures of the type mentioned at the beginning of this text, in which such electrical losses are as low as possible. And note that in very high frequency applications, electrical signals generated in the active layer of the structure can pass through the insulating layer of the structure despite the electrical insulation effect of this layer. As mentioned above, this corresponds to additional losses that are undesirable. Thus, and even more precisely than as described above, there is a need to make structures like those mentioned above in which losses are minimized for such very high frequency applications. The present invention now satisfies these needs.

SUMMARY OF THE INVENTION

The present invention relates to a process for manufacturing a multilayer structure made of semiconducting or semiconductor materials and comprising an active layer, a support layer and an electrically insulating layer between the active layer and the support layer. Preferably, the structure is an SOI structure. The process comprises the improvement where the properties of the electrically insulating layer are modified in order to minimize electrical losses in the support layer and enhance signal quality in the active layer. Typically, the properties of the electrically insulating layer are modified by reducing electrical charge in the electrically insulating layer or by increasing carrier trap density at an interface between the electrically insulating layer and support layer. To reduce electrical charge, the support layer can be selected so as to have a resistivity that is significantly higher than that of the active layer.

The structure is preferably formed by bonding a first substrate comprising the active layer with a second substrate comprising the support layer. Either substrate can contain the electrically insulating layer, but usually this is included on the first substrate. With this arrangement, the properties of the electrically insulating layer can be modified by increasing carrier trap density before the first and second substrates are bonded. One way to do this is by inserting an intermediate layer between the electrically insulating layer of the first substrate and the support layer of the second substrate. Alternatively, the intermediate layer can be made of a material that, due to its association with the material of the support layer, increases carrier trap density at the interface.

The carrier trap density can also be modified by selection of at least one material for the electrically insulating layer, with the selected material increasing carrier trap density due to its association with the material of the support layer. In addition, the carrier trap density can be modified by applying a treatment to the surface region of the second substrate before the first and second substrates are bonded. Such a treatment of the surface region of the second substrate can include a controlled deterioration of the surface condition of the second substrate.

When the structure is formed by bonding a first substrate comprising the active layer with a second substrate comprising the support layer, the electrical charge can be modified within the electrically insulating layer by adjusting the characteristics of an ion implantation made in the first substrate before the first and second substrates are bonded. This is conveniently achieved by adjusting the implantation doses are adjusted to modify the electrical charge in the electrically insulating layer.

Alternatively, when the structure is formed by bonding a first substrate comprising the active layer with a second substrate comprising the support layer, the electrical charge within the electrically insulating layer can be modified by adjusting parameters of a thermal oxidation that is made a surface of the first substrate to create the electrically insulating layer thereon. Here, the parameters to be adjusted include one or more of temperature, temperature variation, gas composition, or annealing times. Instead, the electrical charge within the electrically insulating layer can be modified by adjusting the parameters of a heat treatment that is applied to the structure after the first and second substrates have been bonded. Typically, the heat treatment is applied at a thermal budget that is adjusted to reduce the charge.

BRIEF DESCRIPTION OF THE DRAWINGS

Other aspects, purposes and advantages of the invention will become clear after reading the following description of the invention with reference to the attached drawings in which.

DETAILED DESCRIPTION OF THE PREFERRED EMBODIMENTS

Figure 1:
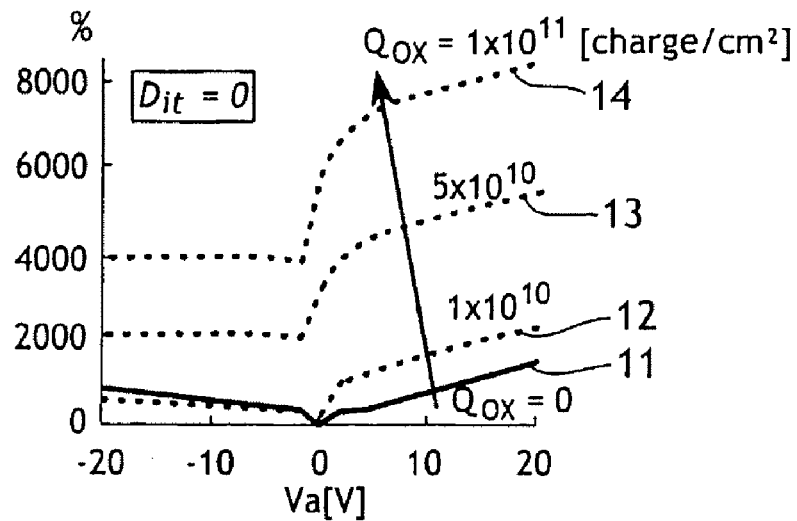
FIG. 1 is a graph derived from simulations, illustrating the variation of a parameter $G_{EFF}$ representing losses associated with the structure as a function of different corresponding values of the electrical charge of the insulating layer, for different structures concerned by the invention.

In order to achieve these purposes, the invention proposes a method of making a multilayer structure made of semiconducting materials and comprising an active layer, a support layer and an electrically insulating layer between the active layer and the support layer, characterized in that the process comprises modification of the density of carrier traps and/or the electrical charge within the electrically insulating layer, in order to minimize electrical losses in the structure support layer.

Other preferred but non-limitative aspects of such a process are as follows:

the modification is intended to increase the density of carrier traps at the interface between the structure insulating layer and the structure support layer, the modification is designed to reduce the electrical charge within the electrically insulating layer of the structure, the active layer is chosen so as to have a much lower resistivity than the support layer, the process includes bonding of a first substrate comprising the structure active layer and a second substrate comprising the structure support layer, the first substrate comprises an insulating layer;

the insulating layer of the first substrate corresponds to the insulating layer of the structure, in order to minimize electrical losses in the structure support layer, the density of the carrier traps is modified before the first substrate and the second substrate are bonded, in order to minimize electrical losses in the structure support layer, the density of the carrier traps is modified by inserting an intermediate layer between the two substrates to be bonded, that will come into contact with the support layer of the second substrate, the material of the intermediate layer being chosen so as to increase the density of the carrier traps, due to its association with the material in the support layer, the intermediate layer is deposited on the second substrate, before the bonding of the first and second substrates, the support layer is made of silicon and the material used in the intermediate layer is a nitrided oxide, the density of carrier traps is modified using at least one material that tends to increase the density of carrier traps due to its association with the material in the support layer, for bonding the first and second substrates, to minimize electrical losses in the structure support layer, the density of carrier traps is modified by applying a treatment to the surface region of the second substrate before the first and second substrates are bonded, in order to minimize electrical losses in the structure support layer, the treatment of the surface region of the second substrate includes controlled deterioration of the surface condition of the second substrate, in order to minimize electrical losses within the structure support layer, the charge is modified in the electrically insulating layer by adjusting the characteristics of an implantation made in the first substrate before the first and second substrates are bonded, the doses of the implantation are adjusted to modify the charge in the electrically insulating layer, the implantation corresponds to a weakening implantation of a SMARTCUT® type process, in order to minimize electrical losses in the structure support layer, the charge within the electrically insulating layer is modified by adjusting the parameters of a thermal oxidation made on the first substrate to create the structure insulating layer on its surface, the parameters include the temperature and/or temperature variation, the gas composition, annealing times, etc.

the charge within the electrically insulating layer is modified by adjusting the parameters of a heat treatment that is applied to the structure once the structure has been formed, in order to minimize electrical losses in the structure support layer, the thermal budget of the heat treatment is adjusted so as to reduce the charge within the electrically insulating layer of the structure, the structure is an SOI, the process uses the steps of the well-known SMARTCUT® process.

Several embodiments of the invention for a multilayer structure like that mentioned in the introduction to this text will now be described. Note that this structure may in particular be an SOI type structure, although this is not limitative. In general, the structures concerned by the invention are typically structures in which the electrical resistivity of the active layer is significantly lower than the resistivity of the structure support layer.

Note also that the process that will be described below may be used in the more general context of implementation of a SMARTCUT® type process for manufacturing the multilayer structure. However, it is quite possible that the process according to the invention could be implemented in the general context of processes for manufacturing multilayer structures different from those obtainable from a SMARTCUT® process. In particular, the process can be used in the general context of a process for making a multilayer structure implementing a step to bond two substrates, and different from the SMARTCUT® process (for example ELTRAN type process, etc.)

Using an SOI type structure example as an illustration, in order to minimize losses associated with this structure, the invention modifies:

the charge within the electrically insulating layer of the structure, and and/or the density of the carrier traps (typically at the interface between the insulating layer and the structure support layer).

It has been determined, after carrying out simulations and experimental observations, that it is possible to reduce losses associated with the structure by:

reducing the electrical charge within the electrically insulating layer of the structure. In this respect, the applicants used the demonstration of how losses are influenced by the value of the parameter $Q_{BOX}$, that corresponds to the electrical charge associated with the insulating layer of the structure (in other words the buried oxide layer in the case of an SOI).

and/or increasing the density of carrier traps, more particularly at the interface between the insulating layer of the structure and its support layer. In this respect, the applicants used the demonstration of how losses are influenced by the value of the parameter $D_{it}$ that corresponds to the density of carrier traps.

In order to avoid any confusion, it is specified that the "carrier traps" (or "carriers") which are referred to are electrical traps which aim at trapping electrical charges which have been put into motion by fixed charges present in the structure. In this respect, the carrier traps are in particular distinct from gettering means which aim at gettering elements such as physical impurities (such impurities can be e.g. metallic ions, for example from heavy metals, etc . . . ).

The present invention uses the demonstration of the two influences mentioned above, namely the values of parameters $D_{it}$ and $Q_{BOX}$. And as a follow up to this demonstration, a series of observations have been conducted on different structures of the type mentioned above, and concerned by the invention. These observations were thus related to different structures to which the different values of the parameters $D_{it}$ and $Q_{BOX}$ were associated, and for which losses were measured. More precisely, the following were selectively modified for each of these structures:

firstly, the electrical charge in the insulating layer of the structure, secondly, the carrier density at the interface between the insulating layer and the structure support layer.

The means of making these modifications will be discussed hereinbelow in more detail. Before presenting the results of numerical simulations and of experiments that have been conducted, we will briefly summarize the principles involved in a method of measuring losses used in the context of these simulations and experiments.

This loss measurement method is usually called loss measurement by coplanar lines. It provides a means of measuring losses up to a certain depth as a function of spreading of electromagnetic fields in the support layer. This depth depends on the spacing between conductors, the frequency and resistivity of the support layer and the oxide thickness.

This measurement method thus uses the following steps for each structure to be characterized:

Structure preparation, by:

Selective etching of the active layer of the structure, stopping the etching depth at the buried oxide insulating layer (remember that examples discussed in this description relate to an SOI), Solid plate metallic deposit on the structure, above the buried oxide with an electrically conducting metal. A one-micron thickness of aluminum can thus be deposited, Dry and selective etching of the deposited metal to form test patterns, actually parallel conducting metallized lines (that form wave guides);

Application of an electrical signal on one of the metallized lines. This signal $V_A$ consists of a superposition of a DC voltage $V_{DC}$ and a low amplitude AC voltage $V_{AC}$. It is applied to the line, and the following can be modified:

the amplitude of the DC component $V_{DC}$, the frequency of the AC component $V_{AC}$, Calculation of losses ($\alpha$=losses in conductors $\alpha_{COND}$+ losses in the layers located below the active layer before it is eliminated by etching $\alpha_{SUB}$), making use of measurements of emitted, transmitted and reflected powers at the ends of the wave guide.

$\alpha_{SUB}$ is extracted from values of $\alpha$ and an estimate of $\alpha_{COND}$ that is considered as being fixed for a given frequency of the applied signal.

Figure 3:
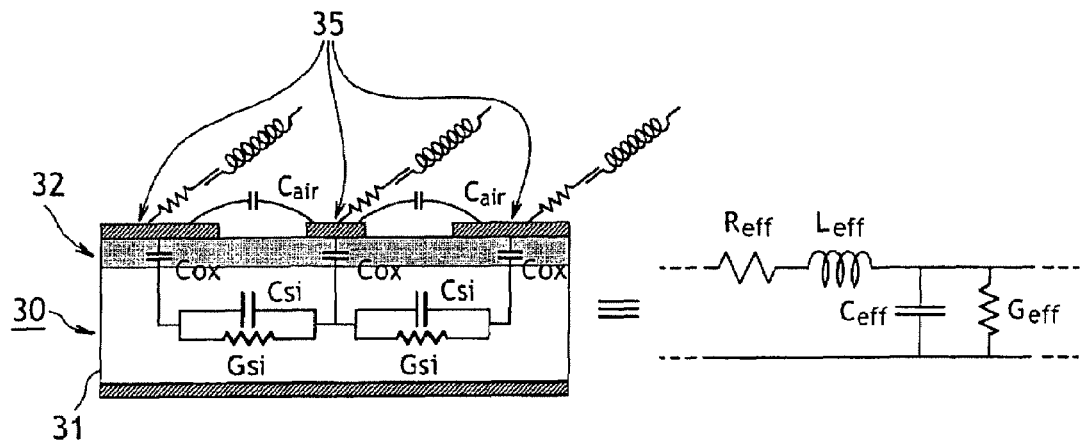
FIG. 3 is a diagram illustrating the principle of a method for measuring electrical losses in a structure such as structures concerned by the invention, the structure being shown in a sectional view, and the right part of the diagram containing a representation of an equivalent electrical circuit.

The principle of this method is illustrated in FIG. 3, that in particular illustrates the wave guides created in different regions of a structure for which losses are to be characterized (the voltage $V_A$ is applied to the central conductor of each coplanar line). The advantage of superposing a DC component on the AC component during the measurements is to demonstrate the considerable effect on losses of a layer with low resistance under the insulation/support layer interface in structures concerned by the invention. As will be explained in more detail in the remainder of this text, this low resistance layer is generated by application of the DC component under the central conductor of the wave guides. It is also strongly influenced by the parameters $Q_{BOX}$ and $D_{it}$. Therefore, the concentration of carriers in this low resistance layer and its global volume (controlled in particular by its thickness), is the reason why $Q_{BOX}$ and $D_{it}$ have an effect on the losses. Losses measured during implementation of this method are used to extract an effective resistivity of the structure (this effective resistivity being directly related to losses).

As mentioned above, and as will be illustrated in detail, the demonstrated influence of the following are used in this invention on structure losses:

the charge of (i.e. within) the buried oxide insulating layer $Q_{BOX}$, the density of carrier traps $D_{it}$.

Figure 2:
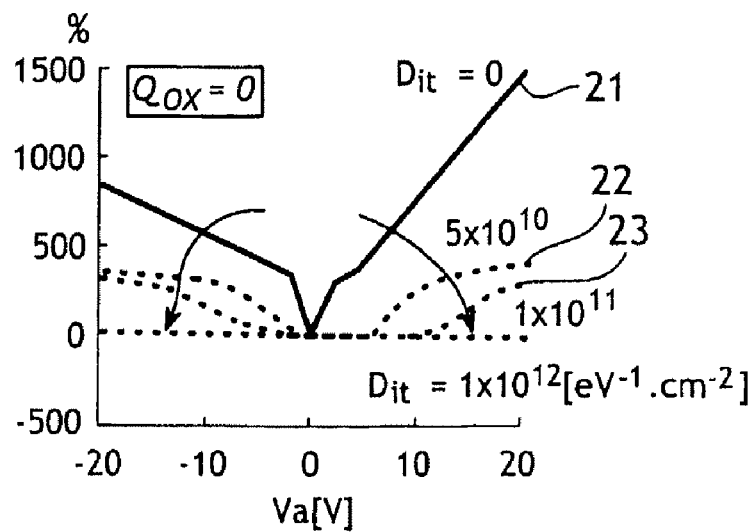
FIG. 2 is a graph of the same type like that illustrated in FIG. 1, also derived from simulations, illustrating the variation of the same parameter $G_{EFF}$ representing losses associated with the structure as a function of the different corresponding values of the density of carrier traps at the interface between the insulating layer and the support layer, for different structures concerned by the invention.

Simulations, for which the results are illustrated in FIGS. 1 and 2, thus demonstrate the corresponding influence of the parameters $Q_{BOX}$ (FIG. 1) and $D_{it}$ (FIG. 2) on losses associated with a structure concerned by the invention. The curves of these two figures are derived from a simulation model that calculates the parallel linear conductance ($G_{EFF}$) of coplanar wave guides made on a structure.

FIG. 3 shows coplanar wave guides made on a structure, and an equivalent distributed circuit (in the right part of the figure). The propagation exponent γ associated with the coplanar wave guide is in the form: $\gamma=(\alpha_{cond}+\alpha_{sub})+J\beta=\sqrt{(Reff+j\omega Leff)\cdot(Geff+J\omega Ceff)}$. The losses $\alpha_{SUB}$ associated with the support layer in the structures are directly proportional to $G_{EFF}$ at high frequencies. Losses $\alpha_{SUB}$ are equal to $\lfloor 0.5*G_{EFF}(L_{eff}/C_{eff})^{0.5}\rfloor$, where $L_{eff}$ and $C_{eff}$ denote the linear inductance and capacitance respectively of the coplanar structure shown in FIG. 3. For a given structure, the losses associated with the structure therefore increase with the value of the parameter $G_{EFF}$ (and vice versa).

The model used is implemented by the Atlas software (registered trademark) of the Silvaco Company. This model is active for taking account of the different dimensional parameters of the coplanar wave guide:

geometry of metallized lines formed on the structure for measurement of losses, thickness of the buried oxide layer (insulating layer) of the structure, voltage $V_A$ applied on the metallized lines (polarization voltage and frequency taken into account).

Furthermore, this model takes account of the parameters $D_{it}$ and $Q_{BOX}$ in the calculation of $G_{EFF}$.

FIG. 1 shows 4 curves 11, 12, 13 and 14 corresponding to four different structures associated with four different values of the parameter $Q_{BOX}$. Each of these curves illustrates the relative variation of structure losses with respect to a reference point (through the parameter $G_{EFF}$ that is directly related to losses as described above), as a function of a voltage $V_A$ that will be applied to a conductor of the structure in the context of the loss measurement method described above. The reference point is fixed to the value of $G_{EFF}$ obtained for $V_{DC}=Q_{BOX}=D_{it}=0$. Curve 11 corresponds to a structure for which the value $Q_{BOX}$ is zero. Curves 12, 13 and 14 correspond to three structures for which the insulating layers have non-zero values of $Q_{BOX}$, increasing from the structure of the curve 12 to the structure of the curve 14 (for which the charge of the insulating layer is equal to $10^{11}$ cm$^{-2}$). The arrow in this figure shows an increase of $Q_{BOX}$ between the structures in the different curves. This figure illustrates that an increase in the value of $Q_{BOX}$ causes an increase in structure losses.

This influence of the parameter $Q_{BOX}$, and therefore the charge of the electrically insulating layer, can be explained as follows. This charge is a positive charge, which therefore tends to attract mobile negative charges (electrons) to the interface between the insulating layer and the support layer (very resistive). An excess of these electrons collects at the interface then forming a surface layer with low resistance, that therefore increases global losses in the support layer.

During implementation of the loss measurement method mentioned above, a slightly negative voltage $V_A$ can be applied to the central conductor to only temporarily push these electrons under the central conductor, which then move away from the interface; this part of the interface then becomes more resistive and the measured losses are reduced. If now the value of $V_A$ is further reduced, the positive mobile charges will in turn be attracted towards the interface and thus locally reduce its resistivity. The loss is thus minimum for a negative voltage $V_{OPT}$. This shift in the minimum losses is illustrated in FIG. 1. Thus, as the value of $Q_{BOX}$ increases, the value of $V_{OPT}$ shifts towards negative values.

Similarly, for a large value of $Q_{BOX}$, the presence of electrons at the interface between the buried oxide insulating layer and the support layer will increase losses (even at $V_{OPT}$ which is the voltage at which the electrons attracted to the insulation/support layer as described above are not present under the central conductor to which the voltage $V_A$ is applied, but are present at other locations of the interface). Therefore, an increase in the value $Q_{BOX}$ between two identical structures induces an increase in losses and a shift towards negative potentials of the value $V_{OPT}$ of $V_A$ for which losses are minimum, as can be seen in FIG. 1.

Similarly, FIG. 2 shows three curves 21, 22, 23 corresponding to three different structures. Each structure is associated with a different value of $D_{it}$, at the interface between its electrically insulating layer and its support layer. Each of these three curves has a minimum near the zero volt abscissa (therefore corresponding to almost identical values $V_{OPT}$). Curve 21 corresponds to a structure associated with a zero value of $D_{it}$. Curves 22 to 24 correspond to structures with a non-zero and increasing $D_{it}$ (from curve 22 to curve 24), the $D_{it}$ associated with the structure of the curve 24 being $10^{12}$ #/cm$^2$/eV. The two arrows on each side of the minimum of the three curves represent this increase in $D_{it}$ between the three structures. It can be seen that an increase in $D_{it}$ reduces losses associated with the structure. It can also be seen that an increase in $D_{it}$ reduces the influence of the DC component of the constant voltage $V_{DC}$ applied to the central metallized line of the structure.

This influence of the parameter $D_{it}$ on losses can be explained as follows: This parameter characterizes the density of traps such as sharp edges, contaminants, or any other trap that could trap a positive or negative mobile charge (electron or hole—which is a vacant space in the crystalline lattice of the material) at the interface between the insulation and the support layer of the structure. A high density at this interface will tend to counter the influence mentioned above related to the tendency to increase the charge of the insulating layer. A high density causes absorption of some electrons that arrive and form the surface layer at the interface and which has the effect of reducing the resistivity (and therefore increasing the losses) of the structure. This effect increases (therefore tending to reduce losses) as the density increases.

Furthermore, the effect of the voltage $V_A$ that attracts electrons or positive charges to the interface (depending on the sign of this voltage) is attenuated by a higher carrier traps density; in this case, some mobile charges attracted towards the interface by the voltage $V_A$ are trapped, and thus neutralized so that they have no influence on losses. Note that the increase in the density of carrier traps is thus applicable in the same way for positive or negative voltages $V_A$.

Figure 4:
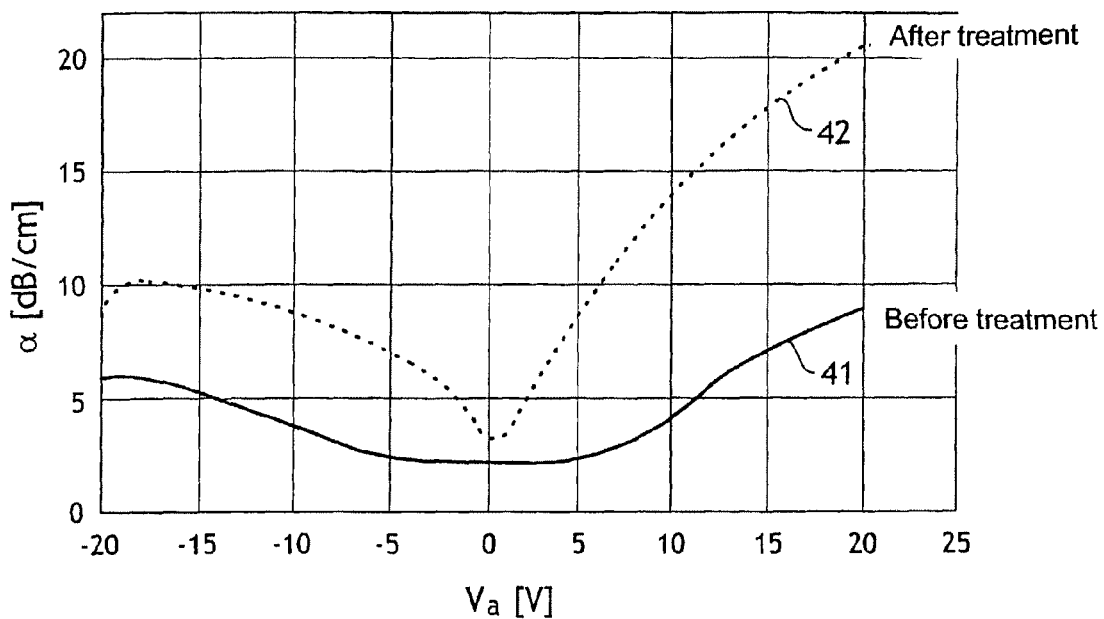
FIG. 4 is a graph derived from experimental measurements and illustrating the influence of a reduction in the density of carrier traps at the interface between the insulating layer and the structure support layer concerned by the invention, on electrical losses measured for a structure concerned by the invention.

The graph in FIG. 4 illustrates the effect of a variation of the parameter $D_{it}$ on losses α. This graph contains two curves, corresponding to two different structures:

An SOI structure obtained by the applicants without any particular treatment (following a SMARTCUT® process), (shown in solid lines, curve 41).

A similar structure subjected to a specific treatment aimed at reducing the value of the parameter $D_{it}$ at the interface between the buried oxide insulating layer and the support layer of the structure (shown in a dashed line, curve 42). This treatment may be annealing under a mix composed of 5% hydrogen and 95% nitrogen, at a temperature of the order of 432° C. for 30 minutes.

In the remainder of the text, the treatment used to obtain this reduction of the parameter $D_{it}$ will be further described. FIG. 4 thus illustrates that a reduction of $D_{it}$ at the interface between the insulating layer and the support layer of the structure increases losses through the structure.

Figure 5:
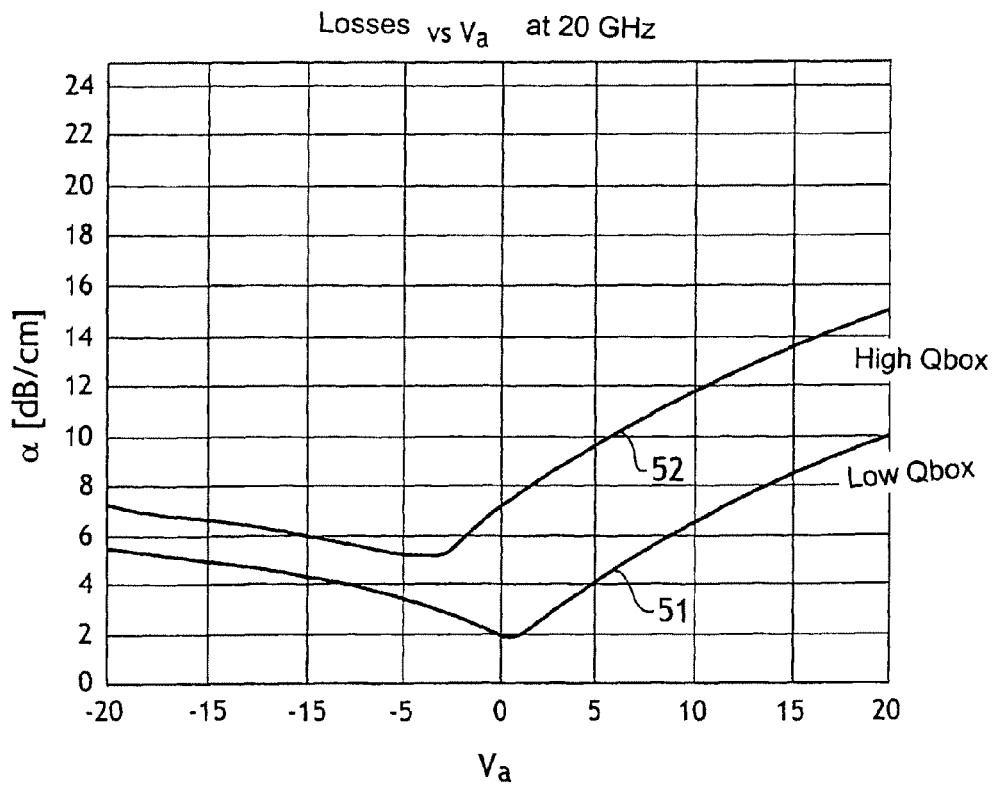
FIG. 5 is a graph of the same type as that shown in FIG. 4, also derived from experimental measurements, illustrating the influence of a modification to the charge within the electrically insulating layer of the structure concerned by the invention on the electrical losses measured for this structure, FIG. 6 diagrammatically illustrates bonding of two substrates to constitute a structure concerned by the invention, at least one of the two substrates having been specifically treated according to one of the embodiments of the invention in order to minimize losses associated with the structure that will be obtained.

Correspondingly, FIG. 5 illustrates the influence of a modification of the value of $Q_{BOX}$ on losses α. FIG. 5 thus represents the variation of losses as a function of the constant voltage applied during characterization of these losses, for two different structures:

A structure with a low $Q_{BOX}$, for example of the order of $1.5 \times 10^{10}$ cm$^{-2}$ (curve 51 that corresponds to an SOI obtained in a manner known in itself by a SMARTCUT® process);

And a structure with a higher $Q_{BOX}$, of the order of $6 \times 10^{10}$ cm$^{-2}$ (curve 52 that corresponds to an oxidized High Resistivity Si wafer in a furnace containing a contaminant—for example a metallic contaminant).

Note that an increase in the parameter $Q_{BOX}$ will increase losses, as previously already mentioned. Also note that the level of $D_{it}$ has not been modified between structures corresponding to curves 51 and 52 respectively.

Figure 6:
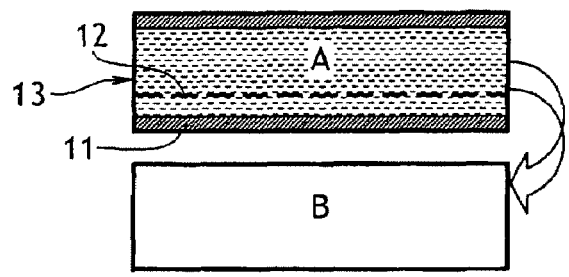

FIG. 6 shows the bonding step for two substrates A and B mentioned above, in the case in which the substrate A has been oxidized (in particular to create a surface oxide layer A1) and an implantation (to create a weakening area A2 defining an active layer A3 within the thickness of substrate A). The substrate B corresponds to the support layer of the required final structure. This case corresponds particularly to the use of the invention in the context of a SMARTCUT® type process.

Figure 7:
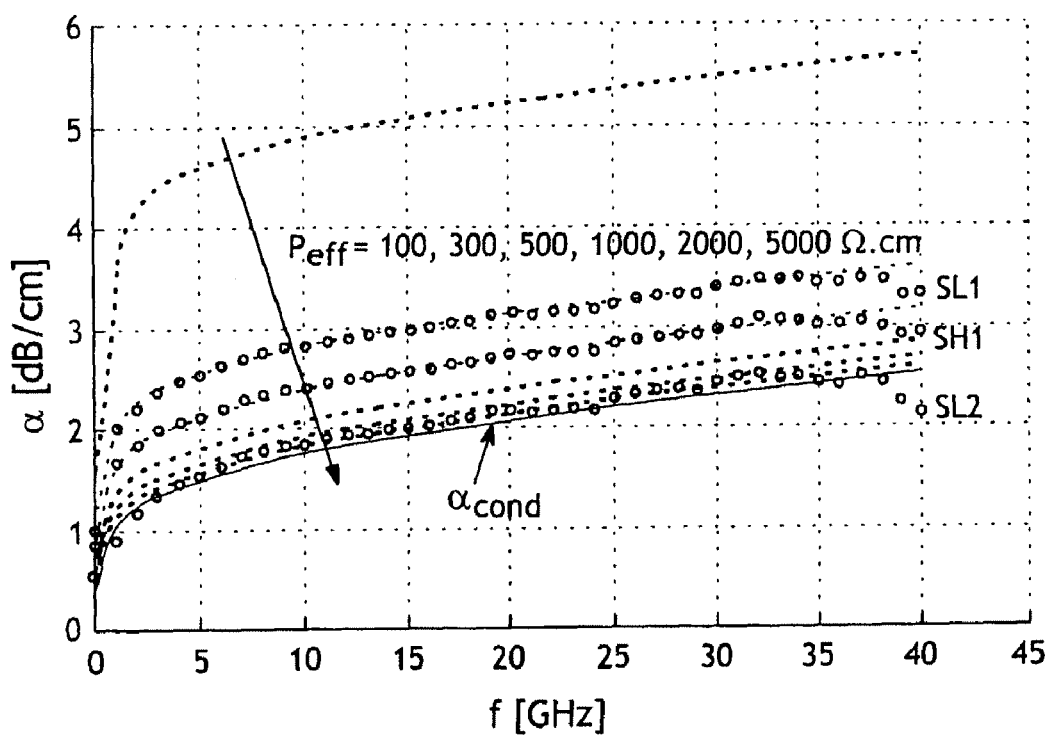
FIG. 7 represents measured losses as a function of the frequency, for different structures with different values for the parameters $Q_{BOX}$ and $D_{it}$.

The curves in FIG. 7 show the variation of losses for $V_{DC}=0$ V as a function of the frequency, for three SOI structures obtained by a SMARTCUT® process with different values of $Q_{BOX}$ and $D_{it}$. The following table gives values of $Q_{BOX}$ and $D_{it}$ for each of these three structures SL1, SL2, SH1.

| Wafer name | $Q_{BOX}$ [#/cm$^2$] | $D_{it}$ [#/cm$^2$/eV] |
|---|---|---|
| SL1 | ~1$^e$10 | Negligible |
| SL2 | ~1$^e$10 | ~1$^e$11 |
| SH1 | ~1$^e$10 where $Q_{BOX.SH1} > Q_{BOX.SL1}$ | Negligible |

The curves in dashed lines correspond to simulated losses of coplanar wave guides made on identical structures, except for the resistivity $\rho_{eff}$ of the support layers of these corresponding structures that vary from 100 Ω.cm (top curve) to 5000 Ω.cm (bottom curve—resistivity values of the support layers increase in the direction of the arrow). The figure shows that theoretical losses reduce as this resistivity $\rho_{eff}$ increases. Note that these theoretical losses contain losses associated with metallic conductors of lines (corresponding to the lowest curve in FIG. 7, shown in continuous lines) and losses in the support layer.

FIG. 7 also shows that the structure with the highest value of $D_{it}$ is the structure that has the lowest losses. Losses in this structure correspond to an effective resistivity of the order of 4000 Ω.cm, which makes losses associated with the support layer negligible compared with losses associated with metallic conductors (since total losses a are equal to the sum of losses $\alpha_{COND}$ and $\alpha_{SUB}$ when $\alpha_{SUB}$ tends towards zero, α becomes equivalent to $\alpha_{COND}$). Structures with low values of $Q_{BOX}$ but negligible values of $D_{it}$ have losses corresponding to resistivity values of the support layer equal to 300 and 500 Ω.cm only. In the case of the invention, a value of the density of carrier traps or a value of charges within the electrically insulating layer of a structure concerned by the invention are thus modified, in order to maximize the electrical resistivity of this structure. And as will be further explained in this text, the density of carrier traps is modified at the interface between a buried layer (e.g. buried oxide of a SOI) and the underlying support layer.

As mentioned above, the invention may be implemented in the context of bonding a first substrate (comprising the active layer of the structure), and a second substrate (comprising the structure support layer). In this case, the first substrate that includes the active layer of the structure may also include the insulating layer of the structure. Before performing this type of bonding, it is possible to modify the density of the carrier traps to increase this density, which as seen above will reduce losses associated with the structure.

Consequently, several variants may be envisaged (either implemented alone or in combination):

Modification of the density of carrier traps by inserting an intermediate layer between the two substrates to be bonded, designed to come into contact with the support layer of the second substrate, the material of the intermediate layer being chosen so as to facilitate an increase in the density of carrier traps, due to its association with the material from which the support layer is made;

In this case, the intermediate layer can be deposited on the second substrate, prior to bonding;

And in a preferred application of the invention, the support layer may be made of silicon and the intermediate layer material may be a nitrided oxide;

In general, the support layer is made of a semiconductor material while the intermediate layer is an oxide or nitride.

Modification of the density of carrier traps, using at least one material for bonding the first and second substrates, that facilitates an increase in the density of carrier traps as a result of its association with the material from which the support layer is made;

Modification of the density of the carrier traps by applying a treatment in the surface region of the second substrate, before the first and second substrates are bonded;

This type of treatment of the surface region of the second substrate may in particular include a controlled deterioration of the surface condition of this second substrate (with the deterioration of its roughness achieved by etching).

In all variants presented above, the density of carrier traps is modified in the resulting structure at the interface between the oxide layer and the underlying support layer. Moreover, still within the context of the invention when used in combination with bonding like that mentioned above, the charge within the electrically insulating layer of the structure can be modified so as to reduce it, according to different variants (once again applied alone or in combination):

Modification of the charge by adjusting the characteristics of an implantation made in the first substrate before bonding;

In this case, the doses of the implantation are preferably adjusted to modify the charge value in the electrically insulating layer;

This implantation may also correspond to the step in which a weakening implantation is made using a SMARTCUT® type process. In this case, the first substrate may be a monocrystalline silicon substrate with a surface that is oxidized before implantation takes place through this oxidized surface, and the second substrate corresponds to the support or stiffener that will be bonded to the first substrate—this first substrate then being separated at the weakening area with a thickness defined in the implantation step, to result in the desired multilayer structure.

Modification of the charge in the electrically insulating layer by adjusting the parameters of a thermal oxidation made on the first substrate before bonding, to create the insulating layer of the structure at its surface;

The parameters on which action is taken include particularly the temperature (absolute value) and/or its variation (particularly the characteristics of the temperature rise gradient), the gas composition and the annealing time;

Once again, the thermal oxidation may correspond to the step in which an oxide layer is created using a SMART-CUT® type process.

Finally, it is also possible to modify the charge within the electrically insulating layer of the structure by adjusting the parameters of a heat treatment that is applied to the structure once it has been formed. In this case, it is indifferent whether or not the two substrates have been bonded beforehand. And in this type of variant adjustment of the charge in the electrically insulating layer of the structure, the thermal budget of the heat treatment is adjusted so as to minimize the charge in this insulating layer.

It is to be noted that modifying the charge within the electrically insulating layer of the structure is quite distinct from influencing the repartition of charges at some interfaces between layers of a structure (the latter technique being disclosed e.g. by U.S. Pat. No. 6,091,112). That patent does in any event not aim at minimizing the losses in the support layer—as the invention does—but it rather aims at avoiding depletion in the active layer. In this respect, this prior art document proposes to influence the characteristics of the active layer, but not of a buried insulating layer as is the case for the invention.

What is claimed is:

1. A process for manufacturing a multilayer structure made of semiconducting materials and comprising an active layer, a support layer and an electrically insulating layer between the active layer and the support layer, which comprises modifying properties of the electrically insulating layer in order to minimize electrical losses in the support layer and enhance signal quality in the active layer.

2. The process of claim 1, wherein the properties of the electrically insulating layer are modified by reducing electrical charge in the electrically insulating layer.

3. The process of claim 2, wherein the structure is formed by bonding a first substrate comprising the active layer with a second substrate comprising the support layer, and wherein the electrical charge is modified within the electrically insulating layer by adjusting the characteristics of an ion implantation made in the first substrate before the first and second substrates are bonded.

4. The process of claim 3, wherein the implantation doses are adjusted to modify the electrical charge in the electrically insulating layer.

5. The process of claim 1, wherein the support layer is selected so as to have a resistivity that is significantly higher than that of the active layer.

6. The process of claim 1, wherein the electrically insulating layer and support layer meet at an interface and the properties of the electrically insulating layer are modified by increasing the carrier trap density at this interface.

7. The process of claim 6, wherein the structure is formed by bonding a first substrate comprising the active layer with a second substrate comprising the support layer.

8. The process of claim 7, wherein the first substrate further comprises the insulating layer so that the structure is an SOI structure.

9. The process of claim 7, wherein the properties of the electrically insulating layer are modified by increasing carrier trap density before the first and second substrates are bonded.

10. The process of claim 7, wherein the carrier trap density is modified by applying a treatment to the surface region of the second substrate before the first and second substrates are bonded.

11. The process of claim 10, wherein the treatment of the surface region of the second substrate includes controlled deterioration of the surface condition of the second substrate.

12. The process of claim 6, wherein the carrier trap density is modified by selection of at least one material for the electrically insulating layer, with the selected material increasing carrier trap density due to its association with the material of the support layer.

13. A process for manufacturing a multilayer structure made of semiconducting materials and comprising an active layer, a support layer and an electrically insulating layer between the active layer and the support layer, which comprises modifying properties of the electrically insulating layer in order to minimize electrical losses in the support layer and enhance signal quality in the active layer, wherein the properties of the electrically insulating layer are modified by inserting an intermediate layer between the electrically insulating layer of the first substrate and the support layer of the second substrate.

14. The process of claim 13, wherein the intermediate layer is made of a material that, due to its association with the material of the support layer, increases carrier trap density.

15. The process of claim 13, wherein the intermediate layer is deposited on the second substrate before the bonding of the first and second substrates.

16. The process of claim 13, wherein the support layer is made of a semiconductor material that includes silicon and the material used in the intermediate layer is a nitride or oxide.

17. A process for manufacturing a multilayer structure made of semiconducting materials and comprising an active layer, a support layer and an electrically insulating layer between the active layer and the support layer, which comprises modifying properties of the electrically insulating layer in order to minimize electrical losses in the support layer and enhance signal quality in the active layer, wherein the structure is formed by bonding a first substrate comprising the active layer with a second substrate comprising the support layer, and wherein the electrical charge within the electrically insulating layer is modified by adjusting parameters of a thermal oxidation that is made on a surface of the first substrate to create the electrically insulating layer thereon.

18. The process of claim 17, wherein the parameters to be adjusted include one or more of temperature, temperature variation, gas composition, or annealing times.

19. The process of claim 17, wherein the electrical charge within the electrically insulating layer is modified by adjusting the parameters of a heat treatment that is applied to the structure after the first and second substrates have been bonded.

20. The process of claim 19, wherein the heat treatment is applied at a thermal budget that is adjusted to reduce the electrical charge in the electrically insulating layer.

* * * * *